US006483347B1

(12) United States Patent
Baker

(10) Patent No.: US 6,483,347 B1
(45) Date of Patent: Nov. 19, 2002

(54) HIGH SPEED DIGITAL SIGNAL BUFFER AND METHOD

(75) Inventor: R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/904,668

(22) Filed: Jul. 11, 2001

(51) Int. Cl.[7] ........................ H03K 19/0175; H03K 3/00

(52) U.S. Cl. ........................... 326/82; 326/26; 326/112; 326/86; 327/206; 327/108

(58) Field of Search .............................. 326/82, 83, 86, 326/22, 26, 112, 119, 120, 121, 122; 327/205, 206, 199, 256, 257, 258, 108

(56) References Cited

U.S. PATENT DOCUMENTS 5,453,704 A 9/1995 Kawashima ................. 326/81
6,239,640 B1 * 5/2001 Liao et al. .................. 327/218

* cited by examiner

*Primary Examiner*—Daniel D. Chang
(74) *Attorney, Agent, or Firm*—Dorsey & Whitney LLP

(57) ABSTRACT

One embodiment of a complimentary input buffer uses six symmetrically arranged inverters. A pair of inverters are coupled between a respective input terminal and a respective output terminal with the input of the inverters coupled to the input terminals and the output of the inverter coupled to the output terminals. The input and output of an inverter are also coupled to each of the output terminals. Finally, a pair of inverters are connected in parallel with each other in opposite directions between the output terminals. In another embodiment, a pair of inverters are also coupled between a respective input terminal and a respective output terminal. However, the output of a respective inverter is coupled to each output terminal, and the inputs of the inverters are coupled to a voltage divider circuit connected between the output terminals.

62 Claims, 4 Drawing Sheets

HIGH SPEED DIGITAL SIGNAL BUFFER AND METHOD

TECHNICAL FIELD

This invention relates to digital circuits, and, more particularly, to a buffer that uses inverters to operate at a high speed and is easily adaptable to buffer complimentary signals and/or provide hysteresis.

BACKGROUND OF THE INVENTION

Input buffers are commonly used in a wide variety of digital circuits. There are also several types of input buffers. For example, there are single ended input buffers in which a single input signal is applied to the buffer to cause the buffer to transition when the input signal transitions through predetermined voltage levels. Single-ended input buffers may also compare the input signal to a reference voltage so the output of the input buffer transitions when the input signal transitions through the reference voltage. There are also complimentary input buffers in which a pair of complimentary signals cause the output of the buffer to transition when one of the input signals transitions through the level of the other input signal.

All of these varieties of buffers generally perform a number of advantageous functions when used in digital circuits. For example, input buffers generally provide a high input impedance to avoid unduly loading signal lines coupled to their inputs. They also condition signals applied to internal circuits so that internal signals have well defined logic levels and transition characteristics. Other advantages of input buffers are also well-known to one skilled in the art.

Although input buffers can provide a number of advantages, they are not without some disadvantages and limitations. For example, considerable circuitry can be required to provide a sufficient number of input buffers to accommodate a large number of input signals. Even more problematic in high speed digital circuitry can be delays in propagating digital signals through input buffers. The time required to propagate input signals through input buffers can greatly increase the time required to couple digital signals to internal circuits used in integrated circuits, thus reducing the operating speed of integrated circuits using such input buffers.

There is therefore a need for an input buffer that uses relatively little circuitry, inherently operates at a fast rate of speed, and that can be readily adapted for use as an input buffer in a wide variety of circuits and applications.

SUMMARY OF THE INVENTION

An input buffer according to the invention uses at least six inverters arranged in a specific topography. A first inverter has an input node coupled to an input terminal of the input buffer and an output node coupled to the output terminal of the input buffer. A second inverter has an input node coupled to either a complimentary input terminal of the input buffer or a reference voltage, and an output node that may be coupled to a complimentary output terminal of the input buffer. A third inverter has an input node coupled to the output terminal of the input buffer and an output node coupled to the output terminal of the input buffer. A fourth inverter has an input node coupled to the output node of the second inverter and an output node coupled to the output node of the second inverter. A fifth inverter has an input node coupled to the output node of the first inverter and an output node coupled to the output node of the second inverter. Finally, a sixth inverter has an input node coupled to the output node of the second inverter and an output node coupled to the output node of the first inverter. The inverters may be implemented using a variety of inverting circuits and amplifiers, including complimentary two-transistor inverting circuits, resistor-transistor inverting circuits and differential amplifiers. Since there is only a single inversion between the input terminal and the output terminal of the input buffer, the input buffer is able to operate at a high speed.

DETAILED DESCRIPTION OF THE INVENTION

Figure 1:
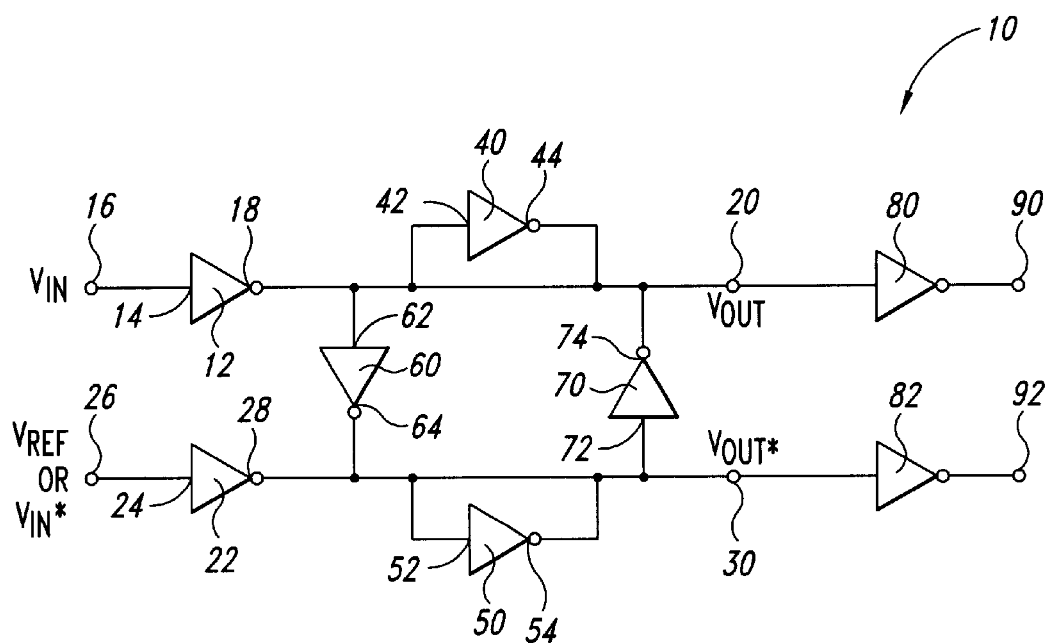
FIG. 1 is a logic diagram of an input buffer in accordance with one embodiment of the invention.

An input buffer 10 according to one embodiment of the invention is shown in FIG. 1. The input buffer 10 includes a first inverter 12 having an input node 14 coupled to an input terminal 16 of the buffer 10 to receive an input signal $V_{IN}$. The input buffer 10 also includes an output node 18 coupled to an output terminal 20 of the buffer to provide an output signal $V_{OUT}$. Thus, there is a single inverter 12 between the input terminal 16 and the output terminal 20 of the buffer 10, thereby ensuring a high speed of operation. Similarly, a second inverter 22 has an input node 24 coupled to a terminal 26, and an output node 28 coupled to a terminal 30 of the buffer 10. The terminal 26 can be coupled to a reference voltage $V_{REF}$, in which case the terminal 30 need not be used. Alternatively, the terminal 26 may be coupled to a complimentary input signal $V_{IN}$*, in which case the terminal 30 is used as a complimentary output terminal to provide a complimentary output signal $V_{OUT}$*.

The buffer 10 also includes a third inverter 40 having an input node 42 and an output node 44, both of which are coupled to the output node 18 of the first inverter 12. Similarly, a fourth inverter 50 has an input node 52 and an output node 54, both of which are coupled to the output node 28 of the second inverter 22.

Finally, the buffer includes a fifth inverter 60 having an input node 62 coupled to the output node 18 of the first inverter 12 and an output node 64 coupled to the output node 28 of the second inverter 22, and a sixth inverter 70 having an input node 72 coupled to the output node 28 of the second inverter 22 and an output node 74 coupled to the output node 18 of the first inverter 12.

Although not required, the input buffer 10 may include respective inverters 80, 82 or other circuits coupling the output terminals 20, 30, respectively, to extended output terminals 90, 92, respectively.

In operation, assume the magnitude of $V_{IN}$ is initially less than the magnitude of $V_{IN}$* (or $V_{REF}$ as the case may be).

When $V_{IN}$ increases above, $V_{IN}$*, the current provided by the inverter 12 initially starts to decrease. As a result, the output voltage $V_{OUT}$ also starts to decrease. The reduced output voltage $V_{OUT}$ causes less current to be drawn from the inverter 40, thereby causing the current output from the inverter 70 to increase to provide the current lost from the inverter 40. The increased current from the inverter 70 also compensates to some extent for the decrease in current provided by the inverters 12, 40. However, as the inverter 12 draws an increasing magnitude of current, the output voltage $V_{OUT}$ continues to decrease and quickly reaches ground potential. When VIN transitions from high to low, the reverse occurs. Specifically, the output current from the inverter 12 increases thereby causing the output voltage $V_{OUT}$ to increase. The increased output voltage $V_{OUT}$ causes more current to be drawn from the inverter 40, thereby causing the current output from the inverter 70 to decrease to draw current provided by the inverter 40. The decreased current from the inverter 70 also compensates to some extent for the increase in current provided by the inverters 12, 40. However, the increasing magnitude of current provided by the inverter 14 causes the output voltage $V_{OUT}$ to quickly increase to $V_{CC}$.

The opposite side of the input buffer 10 involving the inverters 22, 50, 60 operate in the same manner. Significantly, common mode signals, such as noise provided to both input terminals 16, 26 are not coupled to the output terminals 20, 30. The input buffer 10 thus provides very good common mode rejection.

The input buffer can be easily provided with hysteresis by making suitable adjustments to the output impedance of all or some of the inverters 12, 24, 40, 50, 60, 70. For example, hysteresis can be provided by making the output impedances of the inverters 40, 50 greater than the output impedances of the inverters 60, 70, respectively.

Figure 2:
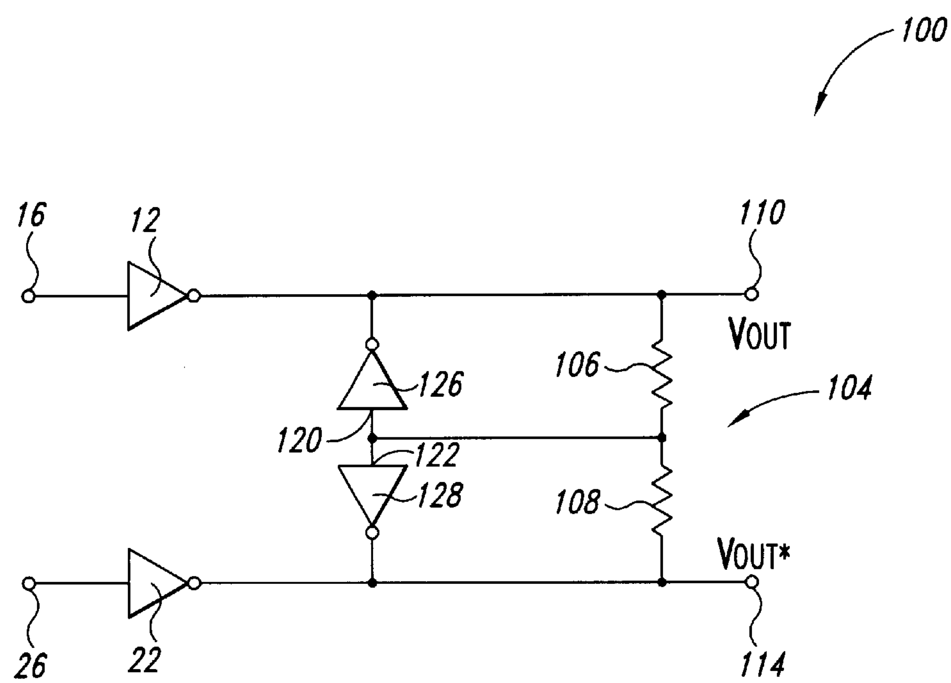
FIG. 2 is a logic diagram of an input buffer in accordance with another embodiment of the invention.

Another embodiment of an input buffer 100 is shown in FIG. 2. The input buffer 100 uses the same inverters 12, 22 and input terminals 16, 26 as the input buffer 10 of FIG. 1. However, instead of using the inverters 40, 50, 60, 70 in the arrangement shown in FIG. 1, the input buffer 100 uses a voltage divider 104 formed by a pair of resistors 106, 108 coupled between output terminals 110, 114. A voltage divider output is coupled to input nodes 120, 122 of a pair of inverters 126, 128, respectively. Output nodes 130, 132 of the inverters 126, 128, respectively, are coupled to respective output terminals 110, 114.

It can be shown mathematically that the input buffer 100 of FIG. 1 is functionally equivalent to the input buffer 10, and it therefore provides similar performance.

Figure 3A:
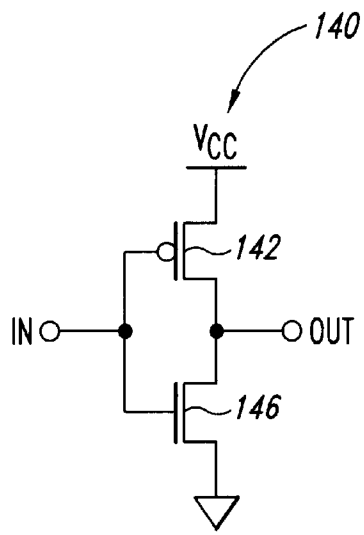
FIGS. 3A–E are schematics of exemplary inverters that can be used in various embodiments of input buffers in accordance with the invention, including the input buffers shown in FIGS. 1 and 2.

The inverters 12, 22, 40, 50, 60, 70, 126, 128 may be any presently known or hereinafter developed inverters, including inverting amplifiers and the inverters shown in FIGS. 3A–E. As shown in FIG. 3A, all or some of the inverters 12, 22, 40, 50, 60, 70, 126, 128 may be implemented with an inverter 140 that includes a PMOS transistor 142 having a source coupled to a supply voltage $V_{CC}$, a gate serving as an input node for the inverter 140, which is coupled to receive an input signal IN, and a drain serving as an output node for the inverter 140, which is coupled to provide an output signal OUT. The inverter 140 also includes an NMOS transistor 146 having a source coupled to ground, a drain coupled to the drain of the PMOS transistor 142, and a gate coupled to the gate of the PMOS transistor 146. When the input signal IN is high, the NMOS transistor 146 is turned ON to couple the output node to ground thereby making the output signal OUT low. When the input signal IN is low, the PMOS transistor 142 is turned OFF to couple the output node to $V_{CC}$ thereby making the output signal OUT high.

Figure 3B:
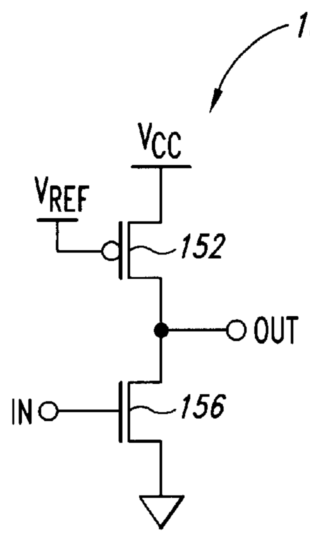

With reference to FIG. 3B, any or all of the inverters 12, 22, 40, 50, 60, 70, 126, 128 may be implemented with an inverter 150 that includes a PMOS transistor 152 having a source coupled to a supply voltage $V_{CC}$, a gate coupled to a reference voltage $V_{REF}$, and a drain serving as an output node for the inverter 150 to provide an output signal OUT. Also includes is an NMOS transistor 156 having a source coupled to ground, a drain coupled to the drain of the PMOS transistor 152, and a gate coupled to an input node for the inverter 150 to receive an input signal IN. When the input signal IN is high, the NMOS transistor 156 is turned ON to couple the output node to ground thereby making the output signal OUT low. The magnitude of the reference voltage $V_{REF}$ and the characteristics of the transistors 152, 156 are chosen so that, although the PMOS transistor 152 is turned ON, the impedance of the NMOS transistor 156 is sufficient low that the output node is coupled to ground, thus making the output signal OUT low. However, the power consumed in this condition is relatively high. When the input signal IN is low, the NMOS transistor 156 is turned OFF thereby allowing the ON PMOS transistor 152 to couple the output node to $V_{CC}$ thereby making the output signal OUT high.

Figure 3C:
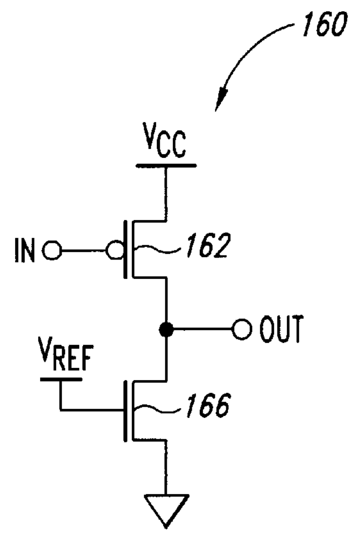

In another inverter 160 shown in FIG. 3C, a PMOS transistor 162 is coupled in series with an NMOS transistor 166 between $V_{CC}$ and ground. A gate of the PMOS transistor 162 serves as an input node for the inverter 160 by receiving an input signal IN. A gate of the NMOS transistor 166 is coupled to a reference voltage $V_{REF}$ to maintain the NMOS transistor 166 in an ON condition. When the input signal IN is high, the PMOS transistor 162 is turned OFF thereby allowing the ON NMOS transistor 166 to couple the output node to ground to make the output signal OUT low. When the input signal IN is low, the PMOS transistor 162 is turned ON thereby coupling the output node to $V_{CC}$ despite the NMOS transistor 166 being ON.

Figure 3D:
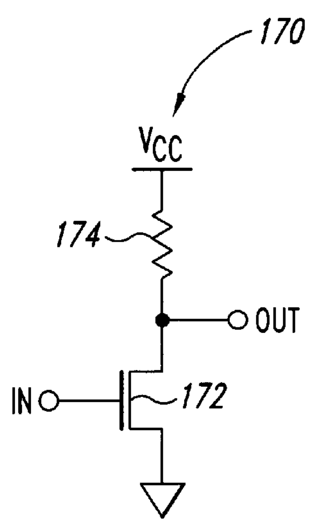

An inverter 170 shown in FIG. 3D uses a single NMOS transistor 172 coupled in series with a resistor 174 between $V_{CC}$ and ground. A gate of the NMOS transistor 172 serves as an input node by receiving an input signal IN, and a drain of the transistor 172 serves as an output node by providing an output signal OUT. The resistor 174 performs the same function as the continuously ON PMOS transistor 152 used in the inverter 150 shown in FIG. 3B, thus causing the inverter 170 to operate in essentially the same manner as the inverter 150.

Figure 3E:
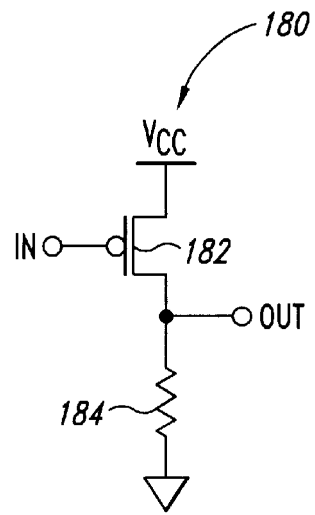

Finally, an inverter 180 shown in FIG. 3E uses a single PMOS transistor 182 coupled in series with a resistor 184 between $V_{CC}$ and ground. A gate of the PMOS transistor 182 serves as an input node by receiving an input signal IN, and a drain of the transistor 182 serves as an output node by providing an output signal OUT. The resistor 184 performs the same function as the continuously ON NMOS transistor 162 used in the inverter 160 shown in FIG. 3C, thus causing the inverter 180 to operate in essentially the same manner as the inverter 160.

Although several different examples of inverters 140, 150, 160, 170, 180 have been shown in FIGS. 3A–E, respectively, it will be understood that other inverting circuits and amplifiers (not shown) may be used.

Figure 4:
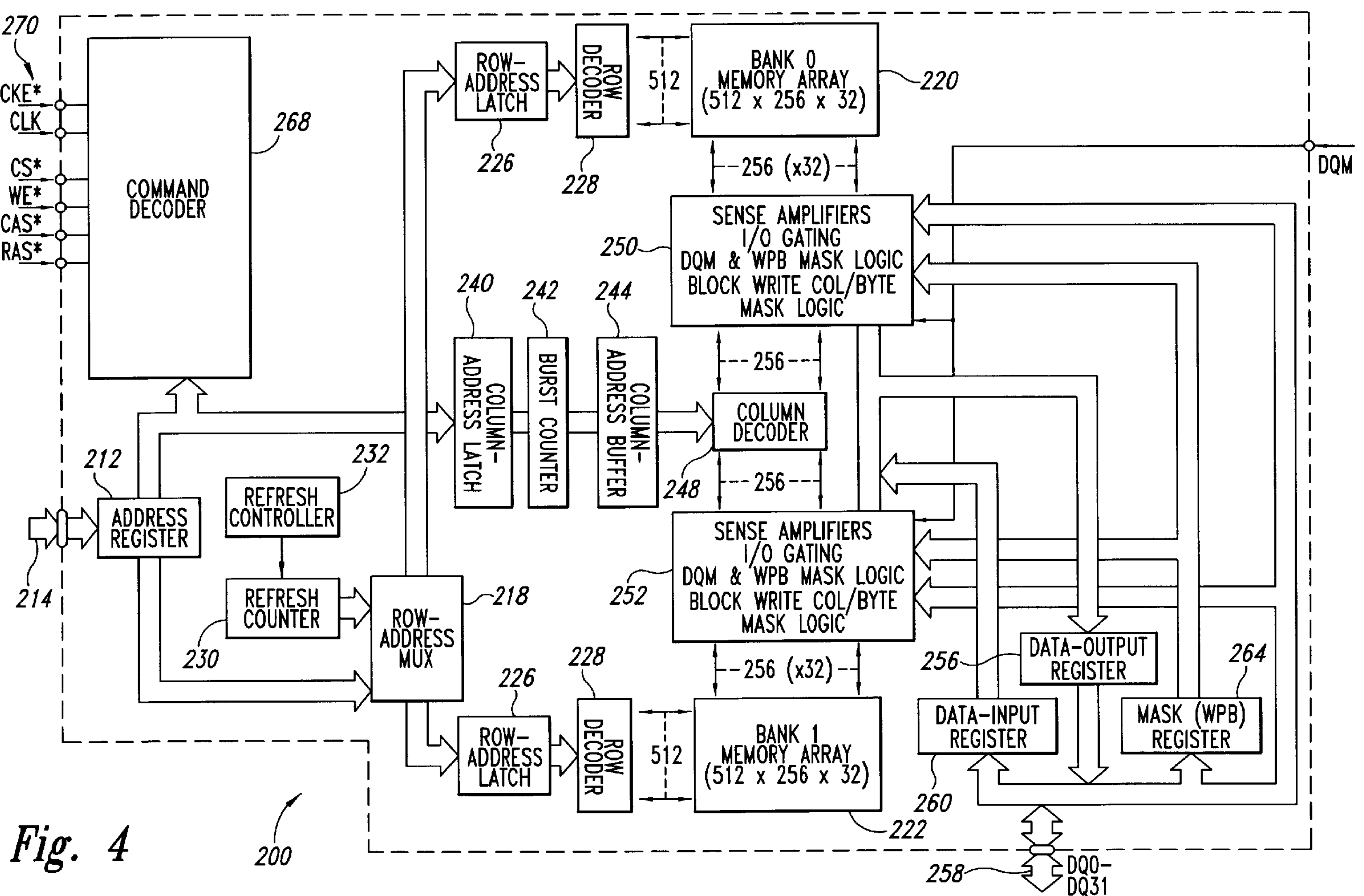
FIG. 4 is a block diagram of a memory device using a clock skew compensation circuit in accordance with an embodiment of the invention.

The input buffers 10, 100 can be used in a wide variety of digital circuits, including a memory device as shown in FIG. 4. The memory device illustrated therein is a synchronous dynamic random access memory ("SDRAM") 200, although the invention can be embodied in other types of synchronous DRAMs, such as packetized DRAMs and RAMBUS DRAMs ("RDRAMS"), as well as other types of digital devices. The SDRAM 200 includes an address register 212 that receives either a row address or a column address on an address bus 214, preferably by coupling address signals corresponding to the addresses though one of the input buffers 10, 100 (FIGS. 1, 2, respectively). The address bus 214 is generally coupled to a memory controller (not shown in FIG. 4). Typically, a row address is initially received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which applies various signals to its respective array 220 or 222 as a function of the stored row address. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248 which applies various signals to respective sense amplifiers and associated column circuitry 250, 252 for the respective arrays 220, 222.

Data to be read from one of the arrays 220, 222 is coupled to the column circuitry 250, 252 for one of the arrays 220, 222, respectively. The data is then coupled through a read data path 254 to a data output register 256, which applies the data to a data bus 258. Data to be written to one of the arrays 220, 222 is coupled from the data bus 258 through one of the input buffers 10, 100 (FIGS. 1, 2, respectively), a data input register 260 and a write data path 262 to the column circuitry 250, 252 where it is transferred to one of the arrays 220, 222, respectively. A mask register 264 may be used to selectively alter the flow of data into and out of the column circuitry 250, 252, such as by selectively masking data to be read from the arrays 220, 222.

The above-described operation of the SDRAM 200 is controlled by a command decoder 268 responsive to command signals received on a control bus 270, again, though one of the input buffers 10, 100 (FIGS. 1, 2, respectively). These high level command signals, which are typically generated by a memory controller (not shown in FIG. 6), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 268 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted. The CLK signal may also be coupled though one of the input buffers 10, 100 (FIGS. 1, 2, respectively).

Figure 5:
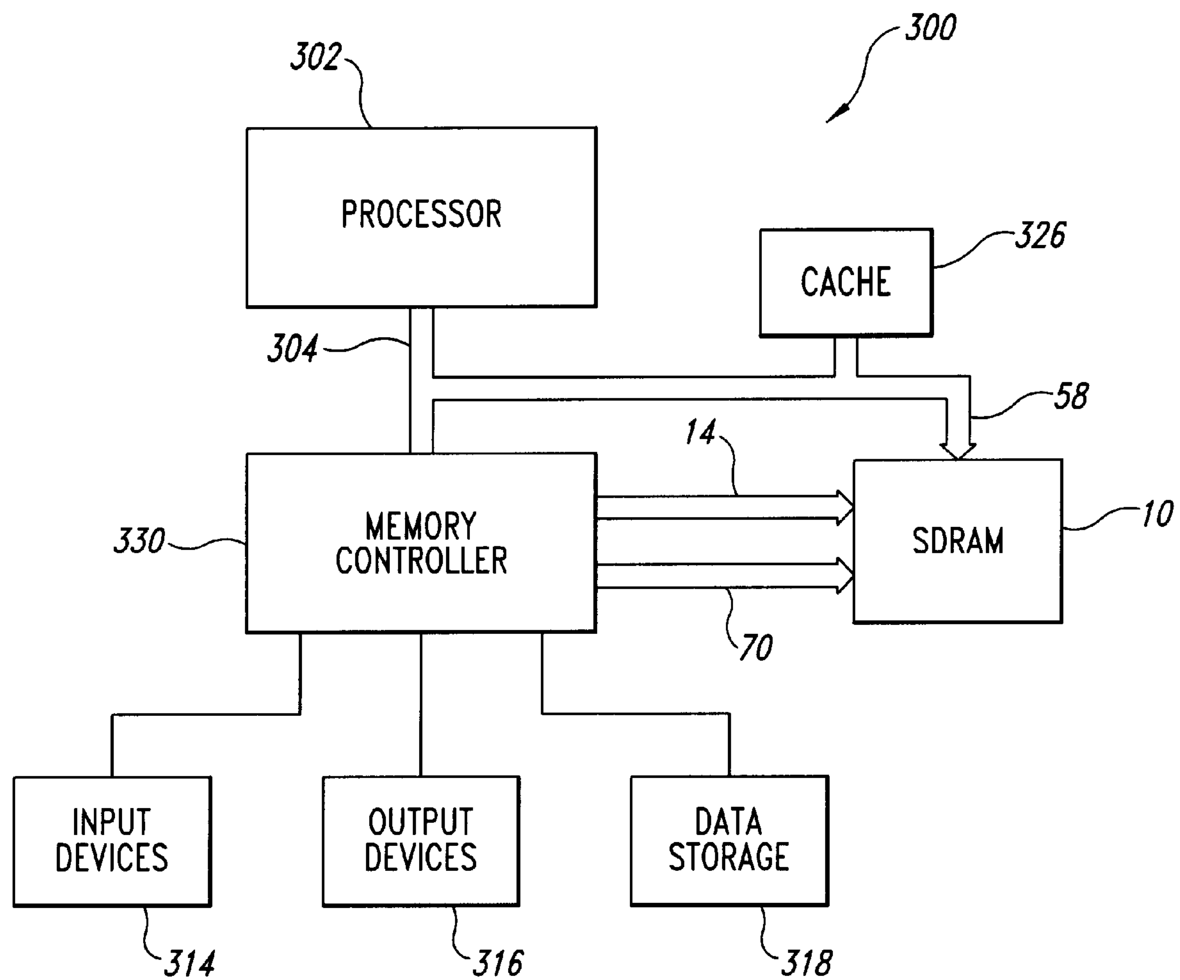
FIG. 5 is a block diagram of a computer system using the memory device of FIG. 4.

FIG. 5 shows a computer system 300 containing the SDRAM 200 of FIG. 4. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200 through a memory controller 330. The memory controller 330 normally includes a control bus 336 and an address bus 338 that are coupled to the SDRAM 200. A data bus 340 is coupled from the SDRAM 200 to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A buffer circuit having an input terminal and an output terminal, comprising:

- a first inverter having an input node coupled to the input terminal and an output node coupled to the output terminal;
- a second inverter having an input node coupled to a reference voltage and to an output node;
- a third inverter having an input node non-invertingly coupled to the output terminal and an output node non-invertingly coupled to the output terminal;
- a fourth inverter having an input node non-invertingly coupled to the output node of the second inverter and an output node non-invertingly coupled to the output node of the second inverter;
- a fifth inverter having an input node coupled to the output node of the fist inverter and an output node coupled to the output node of the second inverter; and
- a sixth inverter having an input node coupled to the output node of the second inverter and an output node coupled to the output node of the first inverter.

2. The buffer circuit of claim 1 wherein the reference voltage comprises a compliment of a digital signal applied to the input terminal.

3. The buffer circuit of claim 1 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the input node of the inverter, and a drain coupled to the output node of the inverter.

4. The buffer circuit of claim 1 wherein at least one of the inverters comprises:

a PMO transistor having a source coupled to a first supply voltage, a gate coupled to the reference voltage, and a drain coupled to the output node of the inverter; and an NMOS transistor having a source coupled to a second supply voltage, a gate coupled to the input no e of the inverter, and a drain coupled to the output node of the inverter.

5. The buffer circuit of claim 1 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the reference voltage, and a drain coupled to the output node of the inverter.

6. The buffer circuit of claim 1 wherein at least one of the inverters comprises:

a resistive element coupled between a first supply voltage and the output node of the inverter; and an NMOS transistor having a source coupled to a second supply voltage, a gate coupled to the input node of the inverter, and a drain coupled to the output node of the inverter.

7. The buffer circuit of claim 6 wherein the resistive element comprises a resistor.

8. The buffer circuit of claim 1 wherein at least one of the inverters comprises:

a PMOS transistor having a source coupled to a first supply voltage, a gate coupled to the input node of the inverter, and a drain coupled to the output node of the inverter; and a resistive element coupled between a second supply voltage and the output node of the inverter.

9. The buffer circuit of claim 8 wherein the resistive element comprises a resistor.

10. The buffer circuit of claim 1 further comprising a seventh inverter having an input node coupled to the output terminal.

11. The buffer circuit of claim 1 wherein the third and fourth inverters have output impedances that are greater than the output impedances of the fifth and sixth inverters, respectively, thereby causing the buffer circuit to have hysteresis.

12. A differential buffer, comprising:

a first inverter having an input node coupled to a first complimentary input terminal and an output node coupled to a first complimentary output terminal;

a second inverter having an input node coupled to a second complimentary input terminal and an output node coupled to a second complimentary output terminal;

a third inverter having an input node non-invertingly coupled to the first complimentary output terminal and an output node non-invertingly coupled to the first complimentary output terminal;

a fourth inverter having an input node non-invertingly coupled to the second complimentary output terminal and an output node non-invertingly coupled to the second complimentary output terminal;

a fifth inverter having an input node coupled to the first complimentary output terminal and an output node coupled to the second complimentary output terminal; and a sixth inverter having an input node coupled to the second complimentary output terminal and an output node coupled to the first complimentary output terminal.

13. The differential buffer of claim 12 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the input node of the inverter, and a drain coupled to the output node of the inverter.

14. The differential buffer of claim 12 wherein at least one of the inverters comprises:

a PMOS transistor having a source coupled to a first supply voltage, a gate coupled to the reference voltage, and a drain coupled to the output node of the inverter; and an NMOS transistor having a source coupled to a second supply voltage, a gate coupled to the input node of the inverter, and a drain coupled to the output node of the inverter.

15. The differential buffer of claim 12 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the reference voltage, and a drain coupled to the output node of the inverter.

16. The differential buffer of claim 12 wherein at least one of the inverters comprises:

a resistive element coupled between a first supply voltage and the output node of the inverter; and an NMOS transistor having a source coupled to a second supply voltage, a gate coupled to the input node of the inverter, and a drain coupled to the output node of the inverter.

17. The differential buffer of claim 16 wherein the resistive element comprises a resistor.

18. The differential buffer of claim 12 wherein at least one of the inverters comprises:

a PMOS transistor having a source coupled to a first supply voltage, a gate coupled to the input node of the inverter, and a drain coupled to the output node of the inverter; and a resistive element coupled between a second supply voltage and the output node of the inverter.

19. The differential buffer of claim 18 wherein the resistive element comprises a resistor.

20. The differential buffer of claim 12 further comprising a seventh inverter having an input node coupled to the first complimentary output terminal.

21. The differential buffer of claim 12 wherein the third and fourth inverters have output impedances that are greater than the output impedances of the fifth and sixth inverters, respectively, thereby causing the buffer circuit to have hysteresis.

22. A memory device, comprising:

a row address circuit operable to receive row address signals applied to an external terminal and to decode the row address signals to provide a row address;

a column address circuit operable to receive column address signals applied to an external terminal and to decode the column address signals to provide a column address;

at least one array of memory cells operable to store data written to or read from the array at a location determined by the row address and the column address;

a data path circuit operable to couple data signals corresponding to the data between the at least one array and an external data terminal;

a command signal generator operable to generate a sequence of control signals corresponding to command signals applied to an external terminal; and a buffer circuit coupled to at least one of the external terminals, the buffer circuit comprising:

a first inverter having an input node coupled to the external terminal and an output node coupled to an output terminal;

a second inverter having an input node coupled to a reference voltage and to an output node;

a third inverter having an input node non-invertingly coupled to the output terminal and an output node non-invertingly coupled to the output terminal;

a fourth inverter having an input node non-invertingly coupled to the output node of the second inverter and an output node non-invertingly coupled to the output node of the second inverter;

a fifth inverter having an input node coupled to the output node of the first inverter and an output node coupled to the output node of the second inverter; and a sixth inverter having an input node coupled to the output node of the second inverter and an output node coupled to the output node of the first inverter.

23. The memory device of claim 22 wherein the input node of the second inverter is coupled to a complimentary external terminal so that the reference voltage comprise a compliment of a digital signal applied to the input node of the first inverter.

24. The memory device of claim 22 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the input node of the inverter, and a drain coupled to the output node of the inverter.

25. The memory device of claim 22 wherein at least one of the inverters comprises:

a PMOS transistor having a source coupled to a first supply voltage, a gate coupled to the reference voltage, and a drain coupled to the output node of the inverter; and an NMOS transistor having a source coupled to a second supply voltage, a gate coupled to the input node of the inverter, and a drain coupled to the output node of the inverter.

26. The memory device of claim 22 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the reference voltage, and a drain coupled to the output node of the inverter.

27. The memory device of claim 22 wherein at least one of the inverters comprises:

a resistive element coupled between a first supply voltage and the output node of the inverter; and an NMOS transistor having a source coupled to a second supply voltage, a gate coupled to the input node of the inverter, and a drain coupled to the output node of the inverter.

28. The memory device of claim 27 wherein the resistive element comprises a resistor.

29. The memory device of claim 22 wherein at least one of the inverters comprises:

a PMOS transistor having a source coupled to a first supply voltage, a gate coupled to the input node of the inverter, and a drain coupled to the output node of the inverter; and a resistive element coupled between a second supply voltage and the output node of the inverter.

30. The memory device of claim 29 wherein the resistive element comprises a resistor.

31. The memory device of claim 22 further comprising a seventh inverter having an input node coupled to the output terminal.

32. The memory device of claim 22 wherein the third and fourth inverters have output impedances that are greater than the output impedances of the fifth and sixth inverters thereby causing the buffer circuit to have hysteresis.

33. A computer system, comprising:

a processor having a processor bus;

an input device coupled to the processor through the processor bus adapted to allow data to be entered into the computer system;

an output device coupled to the processor through the processor bus adapted to allow data to be output from the computer system; and a memory device coupled to the processor bus adapted to allow data to be stored, the memory device comprising:

a row address circuit operable to receive row address signals applied to an external terminal and to decode the row address signals to provide a row address;

a column address circuit operable to receive column address signals applied to an external terminal and to decode the column address signals to provide a column address;

at least one array of memory cells operable to store data written to or read from the array at a location determined by the row address and the column address;

a data path circuit operable to couple data signals corresponding to the data between the at least one array and an external data terminal;

a command signal generator operable to generate a sequence of control signals corresponding to command signals applied to an external terminal; and a buffer circuit coupled to at least one of the external terminals, the buffer circuit comprising:

a first inverter having an input node coupled to the external terminal and an output node coupled to an output terminal;

a second inverter having an input node coupled to a reference voltage and to an output node;

a third inverter having an input node non-invertingly coupled to the output terminal and an output node non-invertingly coupled to the output terminal;

a fourth inverter having an input node non-invertingly coupled to the output node of the second inverter and an output node non-invertingly coupled to the output node of the second inverter;

fifth inverter having an input node coupled to the output node of the first inverter and an output node coupled to the output node of the second inverter; and a sixth inverter having an input node coupled to the output node of the second inverter and an output node coupled to the output node of the first inverter.

34. The computer system of claim 33 wherein the input node of the second inverter is coupled to a complimentary external terminal so that the reference voltage comprise a compliment of a digital signal applied to the input node of the first inverter.

35. The computer system of claim 33 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the input node of the inverter, and a drain coupled to the output node of the inverter.

36. The computer system of claim 33 wherein at least one of the inverters comprises:

a PMOS transistor having a source coupled to a first supply voltage, a gate coupled to the reference voltage, and a drain coupled to the output node of the inverter; and an NMOS transistor having a source coupled to a second supply voltage, a gate coupled to the input node of the inverter, and a drain coupled to the output node of the inverter.

37. The computer system of claim 33 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the reference voltage, and a drain coupled to the output node of the inverter.

38. The computer system of claim 33 wherein at least one of the inverters comprises:

a resistive element coupled between a first supply voltage and the output node of the inverter; and an NMOS transistor having a source coupled to a second supply voltage, a gate coupled to the input node of the inverter, and a drain coupled to the output node of the inverter.

39. The computer system of claim 38 wherein the resistive element comprises a resistor.

40. The computer system of claim 33 wherein at least one of the inverters comprises:

a PMOS transistor having a source coupled to a first supply voltage, a gate coupled to the input node of the inverter, and a drain coupled to the output node of the inverter; and a resistive element coupled between a second supply voltage and the output node of the inverter.

41. The computer system of claim 40 wherein the resistive element comprises a resistor.

42. The computer system of claim 33 further comprising a seventh inverter having an input node coupled to the output terminal.

43. The computer system of claim 33 wherein the third and fourth inverters have output impedances that are greater than the output impedances of the fifth and sixth inverters thereby causing the buffer circuit to have hysteresis.

44. A buffer circuit having an input terminal and an output terminal, comprising:

a first inverter having an input node coupled to the input terminal and an output node coupled to the output terminal;

a second inverter having an input node coupled to a reference voltage and to an output node;

a third inverter having an input node coupled to the output terminal and an output node coupled to the output terminal;

a fourth inverter having an input node coupled to the output node of the second inverter and an output node coupled to the output node of the second inverter;

a fifth inverter having an input node coupled to the output node of the first inverter and an output node coupled to the output node of the second inverter, the fifth inverter having an output impedance that is less than an output impedance of the third inverter, and a sixth inverter having an input node coupled to the output node of the second inverter and an output node coupled to the output node of the first inverter, the sixth inverter having an output impedance that is less than an output impedance of the fourth inverter thereby causing the buffer circuit to have hysteresis.

45. The buffer circuit of claim 44 wherein the reference voltage comprises a compliment of a digital signal applied to the input terminal.

46. The buffer circuit of claim 44 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the input node of the inverter, and a drain coupled to the output node of the inverter.

47. The buffer circuit of claim 44 wherein at least one of the inverters comprises:

a PMOS transistor having a source coupled to a first supply voltage, a gate coupled to the reference voltage, and a drain coupled to the output node of the inverter; and an NMOS transistor having a source coupled to a second supply voltage, a gate coupled to the input node of the inverter, and a drain coupled to the output node of the inverter.

48. The buffer circuit of claim 44 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the reference voltage, and a drain coupled to the output node of the inverter.

49. The buffer circuit of claim 44 wherein at least one of the inverters comprises:

a resistive element coupled between a first supply voltage and the output node of the inverter; and an NMOS transistor having a source coupled to a second supply voltage, a gate coupled to the input node of the inverter, and a drain coupled to the output node of the inverter.

50. The buffer circuit of claim 49 wherein the resistive element comprises a resistor.

51. The buffer circuit of claim 44 wherein at least one of the inverters comprises:

a PMOS transistor having a source coupled to a first supply voltage, a gate coupled to the input node of the inverter, and a drain coupled to the output node of the inverter; and a resistive element coupled between a second supply voltage and the output node of the inverter.

52. The buffer circuit of claim 51 wherein the resistive element comprises a resistor.

53. The buffer circuit of claim 44 further comprising a seventh inverter having an input node coupled to the first complimentary output terminal.

54. A differential buffer, comprising:

a first inverter having an input node coupled to a first complimentary input terminal and an output node coupled to a first complimentary output terminal;

a second inverter having an input node coupled to a second complimentary input terminal and an output node coupled to a second complimentary output terminal;

a third inverter having an input node coupled to the first complimentary output terminal and an output node coupled to the first complimentary output terminal;

a fourth inverter having an input node coupled to the second complimentary output terminal and an output node coupled to the second complimentary output terminal;

a fifth inverter having an input node coupled to the first complimentary output terminal and an output node coupled to the second complimentary output terminal, the fifth inverter having an output impedance that is less than an output impedance of the third inverter; and a sixth inverter having an input node coupled to the second complimentary output terminal and an output node coupled to the first complimentary output terminal, the sixth inverter having an output impedance that is less than an output impedance of the fourth inverter thereby causing the buffer circuit to have hysteresis.

55. The differential buffer of claim 54 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the input node of the inverter, and a drain coupled to the output node of the inverter.

56. The differential buffer of claim 54 wherein at least one of the inverters comprises:

a PMOS transistor having a source coupled to a first supply voltage, a gate coupled to the reference voltage, and a drain coupled to the output node of the inverter; and an NMOS transistor having a source coupled to a second supply voltage, a gate coupled to the input node of the inverter, and a drain coupled to the output node of the inverter.

57. The differential buffer of claim 54 wherein at least one of the inverters comprises:

a PMOS transistor having a source coupled to a first supply voltage, a gate coupled to the input node of the inverter, and a drain coupled to the output node of the inverter; and an NMOS transistor having a source coupled to a second supply voltage, a gate coupled to the reference voltage, and a drain coupled to the output node of the inverter.

58. The differential buffer of claim 54 wherein at least one of the inverters comprises:

a resistive element coupled between a first supply voltage and the output node of the inverter; and an NMOS transistor having a source coupled to a second supply voltage, a gate coupled to the input node of the inverter, and a drain coupled to the output node of the inverter.

59. The differential buffer of claim 58 wherein the resistive element comprises a resistor.

60. The differential buffer of claim 54 wherein at least one of the inverters comprises:

a PMOS transistor having a source coupled to a first supply voltage, a gate coupled to the input node of the inverter, and a drain coupled to the output node of the inverter; and a resistive element coupled between a second supply voltage and the output node of the inverter.

61. The differential buffer of claim 60 wherein the resistive element comprises a resistor.

62. The differential buffer of claim 54 further comprising a seventh inverter having an input node coupled to the first complimentary output terminal.

* * * * *